United States Patent [19]

Forward et al.

[11] 4,156,859

[45] May 29, 1979

[54] NETWORK FOR SIMULATING LOW-NOISE TEMPERATURE RESISTORS

[75] Inventors: Robert L. Forward, Oxnard; Gary D. Thurmond, Calabasas, both of Calif.

[73] Assignee: Hughes Aircraft Company, Culver City, Calif.

[21] Appl. No.: 838,511

[22] Filed: Oct. 3, 1977

[51] Int. Cl.$^2$ ............................................. H03H 5/00
[52] U.S. Cl. .................................... 333/213; 307/230
[58] Field of Search .......................... 333/80 R, 80 T; 323/44 R; 307/230

[56] References Cited

U.S. PATENT DOCUMENTS

| | | | |
|---|---|---|---|
| 3,413,576 | 11/1968 | Sheahan | 333/80 R |
| 3,697,900 | 10/1972 | Irons | 333/80 R |
| 3,818,338 | 6/1974 | Chambers, Jr. et al. | 323/6 X |
| 3,828,281 | 8/1974 | Chambers, Jr. | 333/80 R X |
| 3,927,280 | 12/1975 | Gupta et al. | 333/80 R X |
| 3,993,937 | 11/1976 | Fuhrmann | 323/44 R X |

*Primary Examiner*—Paul L. Gensler
*Attorney, Agent, or Firm*—Don O. Dennison; W. H. MacAllister

[57] ABSTRACT

A class of two-terminal active networks which simulate low-noise temperature resistors is disclosed. A single differential-input operational amplifier connected with a feedback resistor in an inverting amplifier configuration comprises the active element of the network. A dual-transformer feedback arrangement or a single transformer feedback arrangement comprises the remainder of the circuit. Either positive or negative simulated resistors can be obtained with a wide range of equivalent resistance values and effective noise temperatures.

7 Claims, 7 Drawing Figures

NETWORK FOR SIMULATING LOW-NOISE TEMPERATURE RESISTORS

FIELD OF THE INVENTION

This invention relates to single-port electrical networks and more particularly to networks which simulate low-noise temperature electrical resistors.

DESCRIPTION OF THE PRIOR ART

It has long been known that all electrical resistors are characterized by an inherent noise which is due to the thermal agitation of the free electrons within the resistor material. As used herein, the term "resistor", includes any body of conductive material capable of carrying an electrical current. As such, the term embraces components such as wires and other conductors which are not ordinarily thought of "resistors". If a signal current in the resistor or conductor is smaller than the random current due to thermal agitation then, as a practical matter, the signal is masked by the noise and no amount of amplification can separate them. This noise, known as "thermal noise", "Johnson noise" or "white noise", has heretofore generally been accepted as one of the limiting factors in the design of low-level signal processing circuits.

From the research of Johnson and Nyquist in the late 1920s, it is known that the thermal noise voltage across the open ends of a resistor is determined by the formula:

$$e_n^2 = 4kTRB \qquad [1]$$

Where $e_n^2$ is the average of the square of the noise voltage; k is Boltzmann's constant ($1.38 \times 10^{-23}$ joules per °K.); T is the absolute temperature of the conductor in °K.; R is the resistance of the resistor or conductor in ohms and B is the bandwidth in Hertz over which the noise is measured.

In order to reduce the thermal noise of a given resistance R, it is seen from Equation [1] that either the temperature (T) or the bandwidth (B) must be reduced. To reduce B, of course, is generally not possible since the operational bandwidth of a circuit is ordinarily predetermined and is not susceptible to manipulation. In general, therefore, it has been the practice to minimize the thermal noise by cooling the resistor or the entire circuit, in some cases to cryogenic temperatures. However, since the noise voltage is proportional to the square root of the temperature, it is readily understood that it is both costly and cumbersome to provide the degree of cooling required to achieve a significant reduction in thermal noise.

It is therefore an object of the present invention to provide a non-cryogenically cooled low-noise temperature resistance.

In 1939, it was suggested by W. S. Percival that a simulated resistor having an effective noise temperature lower than ambient temperature could be realized by feedback means. (See: W. S. Percival, *An Electrically "Cold" Resistance*, The Wireless Engineer, Vol. 16, May 1939, pp. 237-240.) Utilizing a single transformer between the plate and grid circuit of a vacuum tube amplifier Percival simulated a resistance having an effective temperature of 70° K. The same technique was later expanded upon by Strutt and Van der Ziel in an article entitled, "*Suppression of Spontaneous Fluctuations in Amplifiers and Receivers for Electrical Communication and for Measuring Devices*", Physica, Vol. 9, No. 6, June 1942, pp. 513, 527. Professor Van der Ziel also briefly summarized the techniques in his treatise "Noise", Prentice-Hall, New York, N.Y. 1954, pp. 291-283. (See also: U.S. Pat. No. 2,352,956; M. J. O. Strutt, et al.; July 4, 1944.)

The circuits of the prior art appear to have received little attention in the several decades since their introduction. This may be due to the many shortcomings in the use of vacuum tubes such as their high operating temperatures and the other sources of noise inherent therein. In any event, recent advances in solid state technology have produced many sophisticated, highly efficient, low-cost active circuit elements which allow the synthesis of economical low-noise temperature resistance simulating circuits.

It is yet another object of the present invention to provide an active circuit which simulates a low-noise resistor.

A recent attempt at reducing circuit noise by feedback means is illustrated in U.S. Pat. No. 3,839,686 which was issued to W. Vogel on Oct. 1, 1974. According to the teachings of that invention, the induced voltage on a transmission line such as the outer conductor of a coaxial cable can be decreased by a feedback control circuit which includes an amplifier. Although the circuit of Vogel does not simulate a resistance either low-noise or otherwise, it does represent an example of noise reduction employing feedback techniques.

SUMMARY OF THE INVENTION

In keeping with the principles of the present invention, the above and other objects are accomplished in a single-port circuit by sensing the current flow into the port and generating at the port a voltage which is proportional to the current. If the circuit is comprised of ideal components, then the resulting circuit is characterized by an input impedance which obeys Ohm's Law (at least over a given frequency range) and has no thermal noise contribution.

Of course, the non-ideal circuit elements utilized in practical embodiments of the present invention, result in some thermal noise, although much less than that of a passive resistor. By utilizing a differential input operational amplifier, the input and output of which respectively sense the port current and generate the port voltage, ideal performance can be approximated. Thus, active circuits operating at room temperature can be made to approximate a resistors operating at cryogenic temperatures.

In keeping with the present invention, embodiments are disclosed which utilize dual interconnected transformers and single transformers. Circuits for simulating both positive and negative low-noise resistors are disclosed. In order to distinguish the positive low-noise simulated resistors of the present invention from conventional (i.e. noisy) resistors the term "absorbor" has been adopted. Similarly, for the negative low-noise resistors the term "desorbor" has been adopted. In both instances, the "absorbance" and "desorbance" of the circuits of the invention have the traditional dimension of ohms.

BRIEF DESCRIPTION OF THE DRAWINGS

The above-mentioned and other features and objects of the present invention will become more apparent by reference to the following description taken in conjunction with the accompanying drawings wherein like reference numerals denote like elements and in which.

DESCRIPTION OF THE PREFERRED EMBODIMENTS

Figure 1:
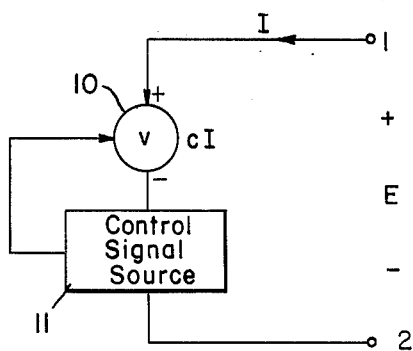
FIG. 1 is a simplified block diagram of an active network which simulates a resistor.

In FIG. 1, there is shown for the purposes of explanation a single-port active network which simulates a passive resistor. The circuit of FIG. 1 comprises an ideal voltage source 10 and an ideal current-responsive control signal source 11 serially connected between the network terminals 1 and 2. (As ideal circuit elements, both control signal source 11 and voltage source 10 have zero internal resistance.) Current-responsive control signal source 11 generates a control signal which is proportional to the current I flowing therethrough. This control signal, in turn, controls the output of voltage source 10 which output voltage is equal to cI, where c is the constant of proportionality. Thus, the voltage E appearing across network terminals 1 and 2 is given by E=cI.

It is seen then that the equation describing the circuit of FIG. 1 is exactly the equation for the voltage drop across a resistor given by Ohm's law with the resistance R having been replaced by the constant of proportionality c. As mentioned hereinabove, the network of FIG. 1 utilizes ideal circuit elements, that is, components with no internal resistance. The thermal noise voltage $e_n$, of the resistance thus simulated is therefore, zero. It is seen then that it is possible to realize a resistor by means of active circuit elements and that the resulting resistor has the property of zero thermal noise.

As a practical matter, of course, it is not possible to realize the circuit of FIG. 1 with perfect circuit elements. All practical circuits are characterized by finite internal resistances and concomitant thermal noise and in most cases by inherent bandwidth limitations. To the extent that the circuits described hereinafter employ non-ideal circuit elements so to will the resulting circuits depart from ideal. Because of the versatility and advantages enjoyed by operational amplifiers, the embodiments described hereinbelow will be illustrated utilizing "op-amps" as the active circuit elements. It is understood, however, that other amplifying devices such as discrete transistors may be employed in many instances.

Figure 2:
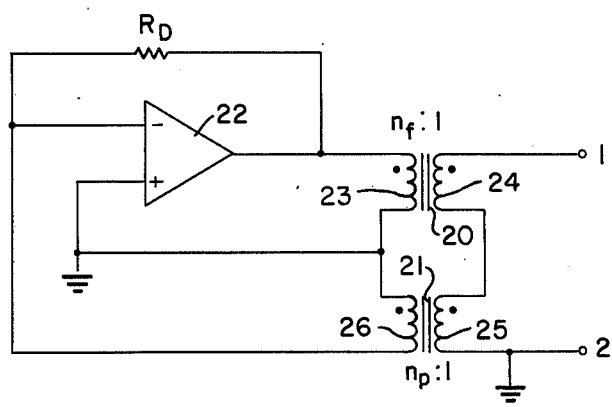
FIG. 2 is a schematic diagram of a preferred embodiment of the present invention.

Referring more specifically to the schematic diagram of FIG. 2, there is shown a basic two-transformer embodiment of the present invention. In FIG. 2, a first transformer 20 termed the "feedback transformer", having a turns ratio $n_f$:1 is provided with its input winding 23 connected between the output of op-amp 22 and ground. The output winding 24 of transformer 20 is serially connected with the input winding 25 of a second or "pickoff" transformer 21 to form the two network terminals 1 and 2. The input/output turns ratio of pickoff transformer 21 is designated 1:$n_p$.

The output winding 26 of pickoff transformer 21 is serially connected with the input winding 23 of feedback transformer 20 with the common junction at ground. The output winding 26 of transformer 21 is also connected between the differential inputs of op-amp 22, with the noninverting input thereof being at ground. A resistor $R_D$ is provided between the output and inverting input of op-amp 22 completing the amplifier feedback path.

Again, assuming an ideal operational amplifier 22 and lossless transformers 20 and 21, an analysis of the circuit of FIG. 2 yields a value for the absorbance, or equivalent resistance looking into terminals 1-2 of:

$$R_{eq} = R_D / n_f n_p \quad [2]$$

The noise voltage $e_n$ at terminals 1-2 is given by the equation:

$$e_n^2 = (1/n_f^2) 4kTBR_D \quad [3]$$

or substituting in equation 1, $$e_n^2 = (n_p/n_f) 4kTBR_{eq}. \quad [4]$$

Where, again, k is Boltzmann's constant, T is the absolute temperature and B is the bandwidth in Hertz over which the noise is measured.

As mentioned hereinabove, ideal circuit components do not exist and departures from ideal cause departures in the equations defining the circuit operation. As a matter of fact, in addition to stray circuit resistances which give rise to thermal noise, the operational amplifier (or other active device) contributes to the total noise. Referring to the diagram of FIG. 3, there is shown a circuit model of an operational amplifier which, as a first approximation, takes into account its input-referred noise components.

Figure 3:
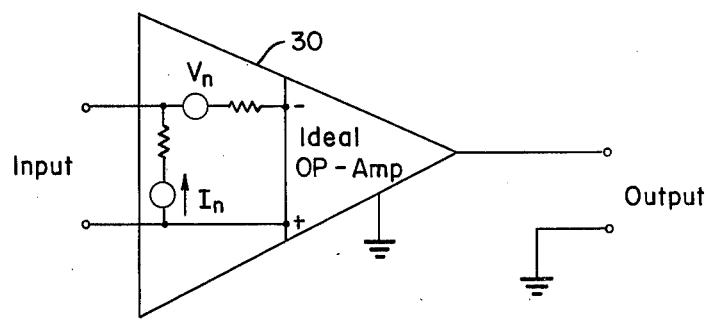
FIG. 3 is a circuit model of an operational amplifier illustrating its input-referred voltage and current noise sources.

The circuit model of the op-amp of FIG. 3 comprises an ideal section 30 with its conventional inverting and noninverting input ports and an output port. The op-amp noise sources are modeled as a series voltage-noise generator $V_n$ and a shunt current-noise generator $I_n$ at the input ports. When the noise model of FIG. 3 is substituted for the ideal op-amp of FIG. 2, a circuit analysis yields a noise voltage at terminals 1-2 given by:

$$e_n^2 = \left(\frac{1}{n_f} - \frac{1}{n_p}\right)^2 V_n^2 + (I_n n_p R_{eq})^2 + \left(\frac{n_p}{n_f}\right) 4kTB\, R_{eq} \quad [5]$$

Although the circuit noise contribution of the transformers is not accounted for, they are nevertheless present. However, as a practical matter their noise contributions are relatively small compared to the contribution of the non-ideal operational amplifier and may therefore be disregarded.

Although not shown, it is understood that an appropriate direct current power source is necessary for powering the op-amps utilized in the various embodiments of the present invention. Also not shown are the bypass capacitors which in some cases may be desirable to prevent spurious circuit operation. In both cases, however, such modifications are trivial and are in keeping with ordinary circuit design practice.

By taking the limit of Equation [5] as the turns ratio $n_f$ goes to infinity, a relationship for the minimum noise of the circuit of FIG. 2 can be found. That is, as $n_f \to \infty$ and $n_p \to \infty$ so that $n_p/n_f$ remains constant, the value for $n_p$ yielding the lowest noise $e_n$ is given by $$n_p^2 = V_1/I_n R_{eq} \qquad [5a]$$

Substituting into Equation [5] the minimum noise achievable with the absorber circuit of FIG. 2 is:

$$e_n^2(\min) = 2V_n I_n R_{eq} \qquad [5b]$$

Figure 4:
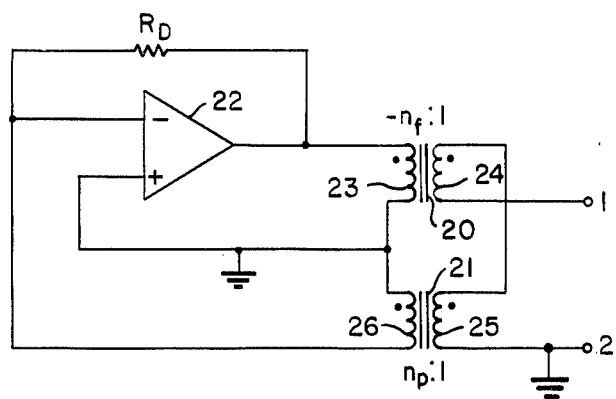
FIG. 4 is a schematic diagram of another embodiment of the present invention which simulates a negative resistor.

Referring now to the schematic diagram of FIG. 4, there is shown a modification of the two-transformer circuit of FIG. 2 which simulates a "desorber" or negative resistance. The reference numerals from the embodiment of FIG. 2 have been carried over to FIG. 4 to designate like circuit elements. The circuit of FIG. 4 is identical to that of FIG. 2 with the exception that the interconnections to the output winding 24 of feedback transformer 20 have been reversed. As a result of this circuit change, the resistance $R_{eq}$ looking into terminals 1-2 is negative and is given by the equation:

$$R_{eq} = -R_D/n_f n_p \qquad [6]$$

The output noise character of the negative resistance circuit of FIG. 4 is very similar to that given in Equation [5] except for the sign in the first term. Thus, for FIG. 4, $$e_n^2 = \left(\frac{1}{n_f} + \frac{1}{n_p}\right)^2 V_n^2 + (I_n n_p R_{eq})^2 + \left(\frac{n_p}{n_f}\right) 4kTB|R_{eq}| \qquad [7]$$

The above equation takes into consideration the noise contributions of operational amplifier 22 but, as before, omits the contribution due to the non-ideal transformers 20 and 21. It is possible, alternatively, to reverse the interconnections to one of the windings of pickoff transformer 21 to obtain the simulated negative resistance circuit.

Figure 5:
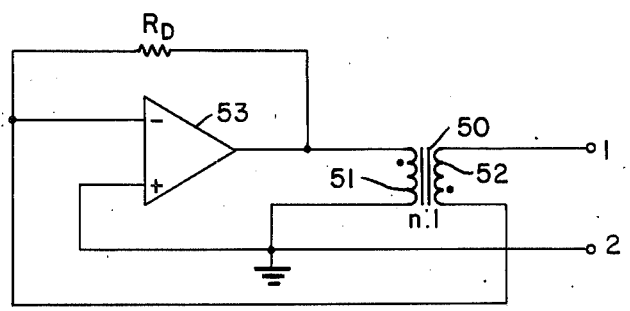
FIGS. 5 and 6 are schematic diagrams of single-transformer embodiments of the present invention which simulate positive and negative resistors, respectively.

Although transformers 20 and 21 have been illustrated as comprising two separate cores and their associated windings, in other cases, a single transformer having but a single pair of windings can be employed with a modest sacrifice in circuit flexibility. Such circuits are shown in the schematic diagrams of FIGS. 5, 6 and 7. In FIG. 5, a single transformer 50 is connected between the output of operational amplifier 53 and ground. A second winding 52 is connected between circuit terminal 1 and the inverting input of op-amp 53. As before, a feedback resistor $R_D$ is provided between the output and inverting input of the operational amplifier. The non-inverting input and the second circuit terminal 2 are both connected to ground. The circuit of FIG. 5 simulates an absorbor or positive resistance $R_{eq}$ given by the equation:

$$R_{eq} = R_D/n \qquad [8]$$

Note that, as shown, the polarity of the windings of transformer 50 are reversed in the case of the circuit of FIG. 5 for the positive equivalent resistance. If one substitutes the non-ideal op-amp circuit of FIG. 3 for the ideal op-amp, it is found that the equation describing the noise performance of this embodiment is given by the relationship:

$$e_n^2 = \left(\frac{1}{n} - 1\right)^2 V_n^2 + I_n^2 R_{eq}^2 + \frac{4kTBR_{eq}}{n} \qquad [9]$$

A comparison of Equation [9] with Equation [5] which describes the noise performance of the two-transformer embodiment of FIG. 2 reveals that the circuit of FIG. 5 can be thought of as a two-transformer circuit wherein transformer 21 is replaced by a transformer having a turns ratio $n_p$ of 1:1.

The loss in circuit flexibility noted hereinabove arises from the fact that the voltage term can be reduced to zero only by utilizing a transformer 50 having a turns ratio of 1:1. By so doing however, improved noise performance is not obtained.

Figure 6:
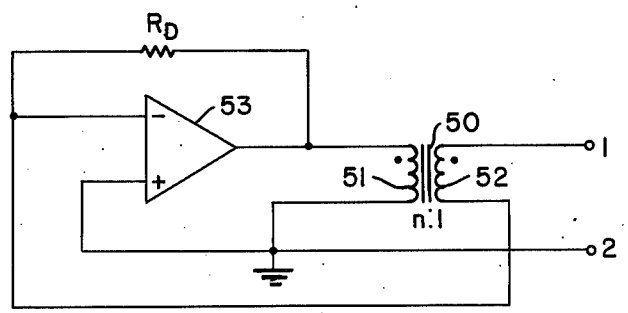

By reversing one of the pair of windings of transformer 50, the positive simulated resistance circuit of FIG. 5 can be converted to a desorbor. Such a modification is shown in the schematic diagram of FIG. 6 wherein like numerals have been carried over from FIG. 5 to designate like structural elements. In FIG. 6, winding 52 of transformer 50 has been reversed as indicated by the dot convention. The equivalent resistance $R_{eq}$ is given by the relation:

$$R_{eq} = -R_D/n \qquad [10]$$

The noise output of the negative resistance circuit of FIG. 6 in turn given by the equation:

$$e_n^2 = \left(\frac{1}{n} + 1\right)^2 V_n^2 + I_n^2 R_{eq}^2 + \frac{4KTB|R_{eq}|}{n} \qquad [11]$$

Figure 7:
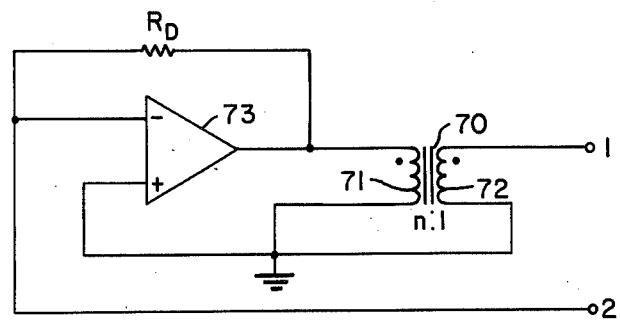
FIG. 7 is an alternate single-transformer embodiment for simulating a positive resistor.

In FIG. 7, there is shown a schematic diagram of an alternate single transformer embodiment which simulates a positive resistance. In FIG. 7, one end of winding 72 of transformer 70 is connected to circuit port 1 as before. The second circuit port 2, however, is connected to the inverting input of op-amp 73. One end of winding 71 of transformer 70 is connected to the output of op-amp 73 and the feedback resistor as before is connected between this output and the inverting input. Finally the second end of winding 71 and 72 of transformer 70 are connected to ground together with the non-inverting input of op-amp 73. The equations describing the equivalent resistance $R_{eq}$ and the noise output are the same for the circuit of FIG. 7 as for that of FIG. 5 described hereinabove. These relationships are defined in Equations [8] and [9], respectively.

In all cases, it is understood that the above-described embodiments are merely illustrative of but a few of the many possible specific embodiments which can represent applications of the principles of the present invention. Numerous and varied other arrangements can be readily devised in accordance with these principles by those skilled in the art without departing from the spirit and scope of the invention.

What is claimed is:

1. A two-terminal network for simulating a resistance comprising:
    at least one transformer having an input and output winding;
    an amplifier having first and second differential input ports and an output port;
    first means for coupling said input winding of said transformer to said output port of said amplifier;

second means for coupling one of said network terminals to one side of said output winding of said transformer;

third means for coupling the other side of said output winding of said transformer to said first input port of said amplifier;

fourth means for coupling the other of said network terminals to said second input port of said amplifier;

a feedback impedance coupled between said output port and one of said input ports of said amplifier, and wherein the resistance simulated at said network terminals is proportional to said feedback impedance and inversely proportional to the turns ratio of said transformer.

2. A two-terminal network for simulating a resistance comprising:

a first transformer having an input and output winding and an input-to-output turns ratio of $n_f$;

an amplifier having first and second differential input ports and an output port;

first means for coupling said input winding of said first transformer to said output port of said amplifier;

second means for coupling one of said network terminals to one side of said output winding of said first transformer;

a second transformer for coupling the other side of said output winding of said first transformer to said first input port of said amplifier, said second transformer having an input-to-output turns ratio of $1/n_p$, and third means for coupling the other of said network terminals to said second input port of said amplifier.

3. The network according to claim 2 including a feedback impedance coupled between said output port and one of said input ports of said amplifier and wherein the resistance simulated at said network terminals is proportional to said feedback impedance and inversely proportional to the product of $n_f$ and $n_p$.

4. A two-terminal network comprising in combination:

an operational amplifier having an inverting input, a noninverting input, an output and a point of reference potential;

a first and second transformer each having an input winding and an output winding;

means for serially connecting the output winding of said first transformer to the input winding of said second transformer to form said network terminals;

means for connecting the input winding of said first transformer between said amplifier output and point of reference potential;

means for connecting the output winding of said second transformer across said inverting and noninverting inputs of said amplifier, said noninverting input being also connected to said point of reference potential; and feedback means coupled between said output and said inverting input of said amplifier.

5. The network according to claim 4 wherein the input-to-output turns ratios of said first and second transformers are $n_f$:1 and $1:n_p$, respectively, and wherein said feedback means comprises a resistor $R_D$.

6. The network according to claim 5 wherein the equivalent resistance across said network terminals is proportional to $R_D$ and inversely proportional to the product of $n_f$ and $n_p$.

7. The network according to claim 5 wherein $n_p$ is substantially unity.

* * * * *